(12) United States Patent
Plavec et al.

(10) Patent No.: US 9,535,109 B2
(45) Date of Patent: Jan. 3, 2017

(54) FAULT DETECTION ASSEMBLY

(71) Applicant: EM Microelectronic-Marin SA, Marin (CH)

(72) Inventors: Lubomir Plavec, Brno (CZ); Zdenek Lukes, Mlada Vozice (CZ)

(73) Assignee: EM Microelectronic-Marin SA, Marin (CH)

( * ) Notice: Subject to any disclaimer, the term of this patent is extended or adjusted under 35 U.S.C. 154(b) by 47 days.

(21) Appl. No.: 14/632,511

(22) Filed: Feb. 26, 2015

(65) Prior Publication Data
US 2015/0260781 A1  Sep. 17, 2015

(30) Foreign Application Priority Data

Mar. 14, 2014  (EP) .................................. 14159970

(51) Int. Cl.
*G01R 31/26*  (2014.01)
*H01L 21/66*  (2006.01)
*H03K 19/003*  (2006.01)
*H01L 27/02*  (2006.01)

(52) U.S. Cl.
CPC ........... *G01R 31/2621* (2013.01); *H01L 22/34* (2013.01); *H01L 27/0266* (2013.01); *H03K 19/00315* (2013.01); *H03K 19/00369* (2013.01)

(58) Field of Classification Search
CPC .............. G01R 31/275; G01R 31/2621; G01R 31/2884; G01R 19/92; H03K 19/315; H03K 19/369; H01L 22/34; H01L 27/248; H01L 27/255
See application file for complete search history.

(56) References Cited

U.S. PATENT DOCUMENTS

| 5,087,955 | A | 2/1992 | Futami |
| 6,069,782 | A * | 5/2000 | Lien .................... H01L 27/0248 361/111 |
| 6,208,494 | B1 | 3/2001 | Nakura et al. |
| 6,249,410 | B1 | 6/2001 | Ker et al. |
| 6,414,831 | B1 * | 7/2002 | Orchard-Webb ... H01L 27/0255 257/355 |
| 2007/0047162 | A1 | 3/2007 | Watanabe et al. |
| 2010/0194452 | A1 | 8/2010 | Hara et al. |

FOREIGN PATENT DOCUMENTS

JP    63-219153    9/1988

OTHER PUBLICATIONS

European Search Report issued Sep. 8, 2014 in European Application 14159970, filed on Mar. 14, 2014.

* cited by examiner

*Primary Examiner* — Minh N Tang
(74) *Attorney, Agent, or Firm* — Oblon, McClelland, Maier & Neustadt, L.L.P.

(57) ABSTRACT

A fault detection assembly of an integrated circuit having a supply port, an input port and a ground port. The fault detection assembly includes a first diode connected with one end to the supply port and connected with the other end to the input port, a second diode connected with one end to the input port and connected with the other end to the ground port, at least a first fault detection transistor of MOS type. At least one of first and second diodes includes a first diode-connected MOS transistor whose gate is connected to the gate of the first fault detection transistor.

13 Claims, 3 Drawing Sheets

FAULT DETECTION ASSEMBLY

This application claims priority from European patent application No. 14159970.4 filed Mar. 14, 2014, the entire disclosure of which is hereby incorporated by reference.

TECHNICAL FIELD

The present invention relates to the field of fault detection assemblies for integrated circuits and in particular to the detection of floating ground. In a further aspect the invention relates to an integrated circuit comprising such a fault detection assembly.

BACKGROUND OF THE INVENTION

Integrated circuits typically comprise a supply port for power supply, a ground port as well as an input port. Via the input port, the integrated circuit can be supplied with electrical signals to be processed by the integrated circuit.

In order to protect the integrated circuit against electrostatic charge or discharge the supply port, the input port and the ground port are provided with a diode arrangement as for instance illustrated in FIG. 1. The integrated circuit 1 comprising a supply port 2, an input port 4 and a ground port 6 has a first diode 8 and a second diode 9 forming a protective diode arrangement to prevent that electrostatic charge or discharge is present to the rather sensitive input port 4.

However, there may arise situations, in which either the supply port 2 or the ground port 6 is disconnected from a supply voltage V1 or from ground. In this case, e.g. with a disconnected supply port 2 and as illustrated in FIG. 1, a voltage V2 present at the input port 4 may propagate from the input port 4 via the diode 8 to the supply port 2.

In such a situation the power supply for the integrated circuit 1 is provided or branched off from the input signal. If for instance an alternating clock signal is present at the input port 4 the electrostatic discharge (ESD) protection diode 8 may rectify the clock signal and may create and provide a supply voltage for the integrated circuit 1. The integrated circuit may then power up unintentionally.

A corresponding situation may also arise when the ground port 6 is disconnected or broken. In this case, the input port 4 may substitute or replace the ground port 6 and the integrated circuit 1 may be supplied through the diode 9.

Interruption of the supply or of the ground may take place either by accident or when the integrated circuit 1 becomes subject to an attack. In these circumstances, the integrated circuit 1 may be unintentionally operated or activated, which may lead to undesired operation modes of the integrated circuit 1, to a damage of the integrated circuit 1 or of the device making use of the integrated circuit 1.

SUMMARY OF THE INVENTION

It is therefore an aim of the present invention to provide an improved fault detection assembly by way of which a floating ground or in general a disconnected supply port or disconnected ground port is detectable. By means of detecting such interrupt or disconnect configurations or situations respective counteracting measures may take place or a control of the integrated circuit or of a respective electronic device can be at least informed about the occurrence of supply line- or ground line-disconnection in order to react accordingly.

The fault detection assembly should exhibit a rather low or even negligible power consumption. In addition, the fault detection assembly should require only a minimum of space to enable a space saving and miniaturized overall design of the fault detection assembly and of the integrated circuit.

In a first aspect, the invention relates to a fault detection assembly of an integrated circuit. The integrated circuit has at least a supply port, an input port and a ground port. The supply port serves as a power supply for the integrated circuit while the ground port provides the corresponding ground or grounding. Via the at least one input port signals to be processed by the integrated circuit can be provided and transferred to and into the integrated circuit.

The fault detection assembly also comprises a protective diode arrangement comprising a first diode and a second diode. Here, the first diode is connected with one end to the supply port and the first diode is connected with the other end to the input. The second diode is connected with one end to the input port and the second diode is connected with the other end to the ground port.

Typically, the two diodes are connected in series with an input node located between the first and second diodes. The input node is further connected with the input port. First and second diodes are typically reverse oriented, such that the input port connected with both, first and second diodes are effectively protected against electrostatic discharge.

In addition the fault detection assembly comprises at least a first fault detection transistor of MOS type (metal oxide semiconductor). At least one of first and second diodes comprises a first diode-connected MOS transistor whose gate is connected to the gate of the first fault detection transistor.

By implementation of at least one fault detection transistor of MOS type and by coupling of the fault detection transistor to a diode-connected MOS transistor of either the first or second diode of the protective diode arrangement, situations wherein a non-negligible discharge or current propagates through at least one of first and second diodes can be effectively detected. By means of this detection a respective detection signal can be generated that can be processed by the integrated circuit accordingly. Typically, the first diode connected MOS transistor and the first fault detection transistor become conductive in the event of either a supply port disconnection or in the event of a ground port disconnection.

Through the respective switching of at least the first fault detection transistor a respective detection signal is generated thereby providing sufficient information to the integrated circuit, in particular that the integrated circuit is currently subject to either supply port disconnection or is subject to ground port disconnection. Thanks to such a detection the integrated circuit is switchable into a protection mode in order to prevent damage to the integrated circuit, which may otherwise arise due to supply port—or ground port disconnection.

According to a further embodiment, one of drain and source of the first fault detection transistor is connected to the input port while the other one of the first fault detection transistor's drain and source is connected to a first resistor. Depending on whether the first or second diode is directly coupled with the at least one fault detection transistor the other end of the first resistor facing away from the first fault detection transistor's drain or source is connected to one of supply port and ground port. Typically, the first resistor is arranged parallel to the supply port or ground port or to a respective supply line or ground line.

By means of the at least first resistor, a fault detection signal provided by the first fault detection transistor can be pulled down or can be pulled up to a voltage level equal or comparable to the voltage level that is present at the supply port. By means of the resistor, typically in series with that terminal of the first fault detection transistor that faces away from the supply port a logical 1 or logical 0 can be provided as a fault detection output, which is to be processed further by at least one logic component of the integrated circuit.

According to a further embodiment, a first detection output is connected to a first node. Said first node is located between the first resistor and the first fault detection transistor. Consequently, the first detection output is connected to the supply port via the first resistor. A voltage drop between the supply port and the input port or between the ground port and the input port is present at the respective resistor, so that the voltage level at the first detection output substantially equals the voltage level at the input port.

In ordinary operation mode, where the supply port as well as the ground port are both connected to respective sources or ground the first fault detection transistor is substantially inoperable. Hence, it is effectively switched off. As a consequence the signal present at the first detection output either equals a logical 1 or 0. It is only due to a disconnection of either the supply port or the ground port, that the first fault detection transistor together with the first diode-connected MOS transistor are switched on thereby switching the signal obtainable at the first detection output. Hence, a logical 0 is switched to a logical 1 and vice versa.

The fault detection assembly is operable to detect ground disconnection and/or supply disconnection. Having only one of first or second diodes implemented as a diode-connected MOS transistor the fault detection assembly is either operable to detect supply disconnection or ground disconnection.

When implemented as supply port disconnection detection assembly, the first diode is implemented as a diode-connected MOS transistor and the first fault detection transistor is connected to the ground port via the at least first resistor. In an alternative configuration of the fault detection assembly configured for detection of ground disconnection it is required that it is the second diode, which is implemented as diode-connected MOS transistor. Then, the first fault detection transistor connected with its gate to the gate of the first diode-connected MOS transistor is connected with one of its drain and source to the input and is further connected with the other one of its drain and source to the supply port via the first resistor.

For implementing the fault detection assembly according to the present invention, it is in principle only required to provide an additional MOS type transistor to act as the first fault detection transistor and to provide a resistor connected to one of supply port and ground port and connected to one of the first fault detection transistor's source and drain. Implementation of the fault detection assembly can therefore be rather simple, space saving and cost efficient. Moreover, during ordinary configuration and operation of the integrated circuit, the fault detection assembly, hence its at least first fault detection transistor is inoperable and switched off. In effect, there is no additional power consumption due to the improved fault detection assembly. This is of particular benefit when the integrated circuit is embedded in battery-driven mobile devices.

Since only one of first and second diodes has to be implemented as a diode-connected MOS transistor the other one of the two diodes may be implemented as a conventional semiconductor diode.

According to another embodiment, the first diode comprises the first diode-connected MOS transistor and the second diode comprises a second diode-connected MOS transistor. In effect, both diodes, first and second diodes each comprise a diode-connected MOS transistor. Implementation of both diodes on the basis of MOS transistors is rather space- and cost efficient.

According to another embodiment, the fault detection assembly comprises a second fault detection transistor of MOS type. The gate of the second fault detection transistor is connected to the gate of the second diode-connected MOS transistor. In this way, the fault detection assembly comprises a first and a second diode-connected MOS transistor, each of which effectively representing or providing a first and a second diode, respectively. With both, first and second diode-connected MOS transistors there is coupled at least one fault detection transistor of MOS type. In such an embodiment occurrences of both, supply port interruptions as well as ground port interruptions can be sensed and detected with one and the same fault detection assembly.

In still another embodiment, one of the drain and source of the second fault detection transistor is connected to the input port while the other one of the second detection transistor's drain and source is connected to a second resistor connected to one of supply port and ground port. Typically, with the first diode connected to the supply port and the input port and the second diode connected to the input port and the ground port the first fault detection transistor is connected with its gate to the gate of the first diode-connected MOS transistor while one of the first fault detection transistor's source and drain is connected to the input port and while the other one of source and drain is connected via the second resistor to the ground port or to a respective ground line.

The second fault detection transistor is arranged in a rather symmetric way compared to the first fault detection transistor. The second fault detection transistor is connected with its gate to the second diode-connected MOS transistor's gate. One of source and drain of the second fault detection transistor is connected to the input port while the other one of source and drain is connected via the second resistor to the supply port or to a supply line.

According to another embodiment, a second detection output is connected to a second node that is located between the second resistor and the second fault detection transistor. In this way, two separate detection outputs can be provided, each of which being pulled up or pulled down to the input voltage level so as to provide a logical 1 or logical 0 in case of supply port interruption or ground port interruption. The signal of the first detection output is typically indicative of a supply port interrupt while the signal obtainable at the second detection output is indicative of a ground port disconnection or interrupt.

By having two different detection outputs, respective interrupt or disconnection scenarios can be separately and independently processed by means of appropriate logic components of the integrated circuit.

According to a further embodiment, the first diode connected transistor is of PMOS type and wherein the second diode-connected MOS transistor is of NMOS type. Providing first and second diode-connected MOS transistors of different types or of CMOS type two reverse oriented diodes can be provided that serve as a protected diode arrangement for the integrated circuit.

The first diode-connected MOS transistor is connected with its gate and with its source to the supply port whereas its drain is connected to the input port. With the second diode-connected MOS transistor, which is of NMOS type, the drain is connected to the input port, whereas the gate and the source are connected to the ground port. Typically, the gate and the sources of first and second diode-connected transistors are arranged and connected in parallel. For reasons of protection of the gates of first and second diode-connected transistors, there may be provided an additional resistor between the supply port and the first diode-connected transistor's gate and/or between the ground port and the second diode-connected transistor's gate.

According to another embodiment, the first fault detection transistor, whose gate is coupled with the first diode-connected transistor is also of PMOS type. The same is also valid for the second fault detection transistor. The second fault detection transistor is of NMOS type as is the second diode-connected transistor whose gate is connected with the second fault detection transistor's gate.

By pair-wise combining first and second diode-connected transistors with first and second fault detection transistors of equal MOS type, the pair of first diode-connected transistor and first fault detection transistor as well as the pair of second diode-connected transistor and second fault detection transistor will simultaneously switch on or off. In this way, the respective fault detection transistor becomes operable to sense and to detect a switching of the respective diode-connected transistor, which will occur in case of either supply port disconnection or ground port disconnection.

In a further embodiment, at least one of the first and second diode-connected transistors comprises numerous parallel connected transistors that are all located on a common MOSFET chip. Here, commercially available MOSFET chips can be used. By having numerous diode-connected transistors in parallel a rather robust diode can be provided.

According to another embodiment, the at least one of first and second fault detection transistors is located also on the MOSFET chip. Typically, the number of parallel connected transistors setting up the first or second diode-connected transistors are located on the same MOSFET chip as the first or second fault detection transistor. Here and in practical implementations only one leg of one of the plurality of transistors of the MOSFET chip has to be connected via respective first or second resistor to the supply port or to the ground port, respectively. In this way a rather space saving arrangement of pairs of diode-connected transistors and corresponding fault detection transistors can be provided.

In another aspect, the invention also relates to an integrated circuit comprising a supply port, an input port and a ground port. The integrated circuit further comprises a fault detection assembly as described above. By means of the fault detection assembly supply port disconnection or interruption and/or ground port disconnection or interruption can be effectively detected and tracked.

In a further embodiment, the integrated circuit comprises a processor or at least a logic component connected to at least one of the first and second detection outputs. The processor or the logic component is operable to process a signal obtained via at least one of the first and second detection outputs. In this way, a signal processing may take place in order to protect the integrated circuit against attacks or against unintentional supply or ground disconnection and/or against floating ground or ground fault occurrences.

In still another aspect, the invention relates to an electronic device configured as a smartcard, as a watch, as a cellular phone or as a smartphone. The electronic device comprises at least an integrated circuit as mentioned above featuring a fault detection assembly as described above and as defined in the appended claims.

BRIEF DESCRIPTION OF THE DRAWINGS

In the following, various embodiments, effects, features and benefits of the present invention will be described by making reference to the drawings, in which.

DETAILED DESCRIPTION OF EMBODIMENTS OF THE INVENTION

Figure 1:
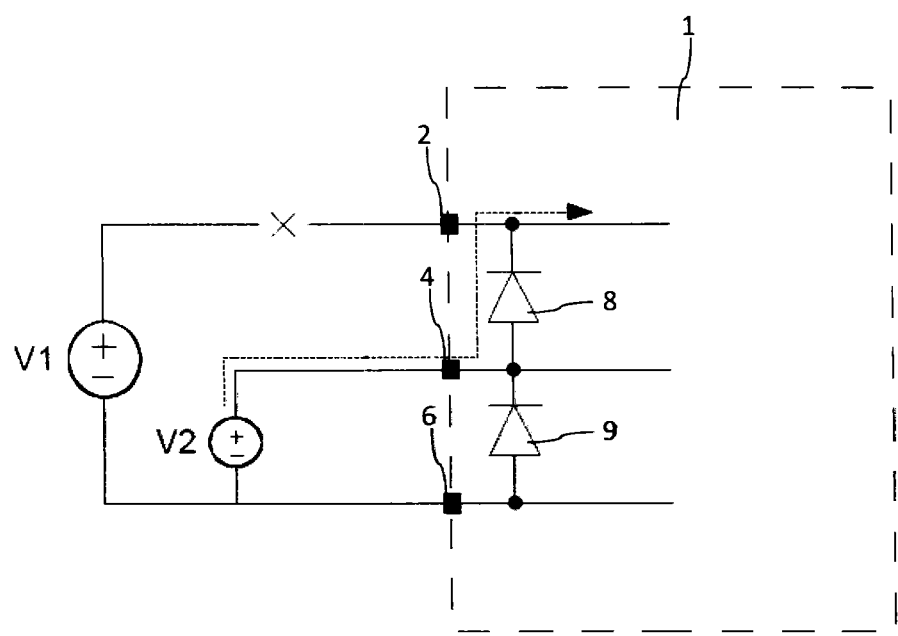
FIG. 1 schematically shows a protective diode arrangement for an integrated circuit according to the prior art, FIG. 2 schematically shows a first embodiment of the present application.
Figure 2:
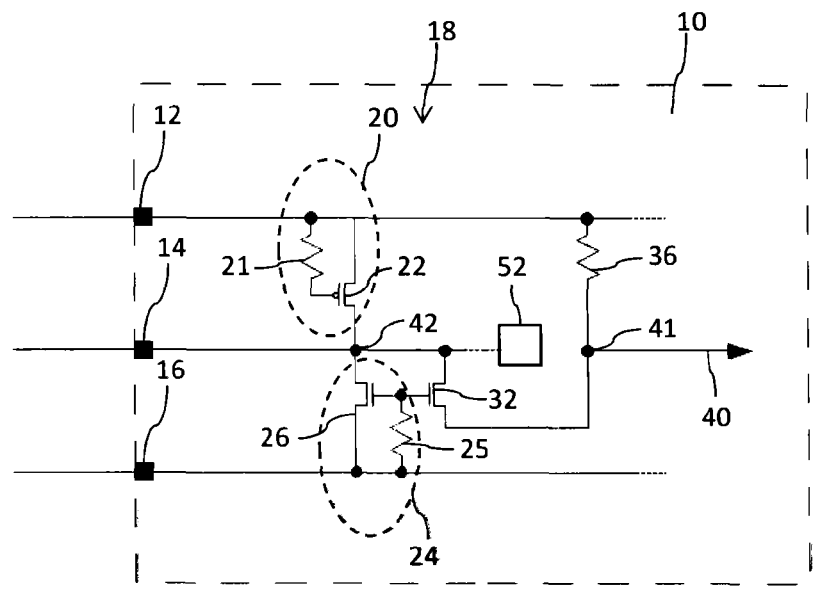

In FIG. 2, a first embodiment of the fault detection assembly 18 according to the present invention is illustrated. The fault detection assembly 18 comprises a first diode 20 and a second diode 24 as well as a fault detection transistor 32 of MOS type. The fault detection assembly 18 is embedded into or is coupled with an integrated circuit 10. The integrated circuit 10 comprises a supply port 12 or a supply terminal, an input port 14 or an input terminal as well as a ground port 16 or a ground terminal. Apart from that the integrated circuit 10 comprises at least one or several logic components 52, typically at least one processor to process signals provided via the input port 14 as input signals.

These additional logic components are not further illustrated here just for reasons of simplicity.

The first and second diodes 20, 24 provide a protection diode arrangement in order to avoid negative impact of electrostatic discharge to the input port 14.

In the present embodiment both diodes 20, 24 comprise one diode-connected MOS transistor 22, 26 as well as a respective resistor 21, 25, by way of which the gates of the transistors 22, 26 are connected to either the supply port 20 or to the ground port 16.

As it is apparent from FIG. 2, the first diode 20 comprises a first diode-connected PMOS transistor 22 whose source is connected to the supply port 12, whose gate is connected parallel to the source to the supply port 12 via a resistor 21. The drain of the first diode-connected transistor 22 is connected to the input port 14.

The second diode-connected transistor 26 is of NMOS type. Its source is connected to the ground port 16 while its drain is connected to the input port. Typically, the drain of the first diode-connected transistor 22 and the drain of the second diode-connected transistor 26 are mutually connected and may form an input node 42 that is connected to the input port 14.

The gate of the second diode-connected transistor 26 is connected parallel to its source to the ground port 16 via an additional resistor 25. The resistors 21, 25 are not required in particular. They provide a protection for the gates of the first and second diode-connected transistors 22, 26.

The fault detection assembly 18 according to FIG. 2 comprises only one fault detection transistor 32, which may be denoted as a second fault detection transistor. The gate of this second fault detection transistor 32 is connected to the gate of the second diode-connected transistor 26. The other two terminals of the second fault detection transistor 32 are connected to the input port 14 and to the supply port 12, respectively. That terminal of the second fault detection transistor 32 that faces away from the input port 14 is connected to a second node 41 from which a second detection output 40 branches off. The second node 41 serves as a second output node from which the second detection output 40 branches off. The second node 41 is connected to the supply port 12 or to a respective supply line via a second resistor 36.

In order to provide a protective diode arrangement the first diode-connected transistor 22 is implemented as a PMOS transistor while the second diode-connected transistor 26 comprises an NMOS transistor as comprises the second fault detection transistor 32.

Figure 3:
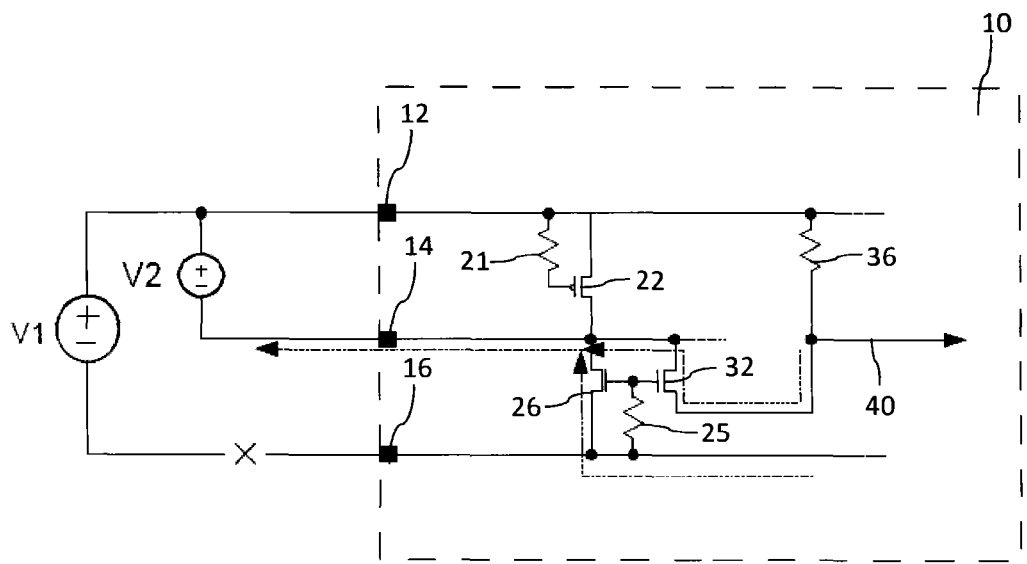
FIG. 3 shows the embodiment according to FIG. 2 in a situation with floating ground or ground fault.

In the following and with reference to FIG. 3, the functionality of the fault detection assembly 18 according to FIG. 2 is described. In the event that the ground port 16 is disconnected from a voltage supply V1 the voltage at the ground port will at least rise to a measurable degree. As a consequence, the second diode-connected transistor 26 as well as the second fault detection transistor 32 will become conductive and will be switched on. As a consequence, a respective charge or current will start to flow through both transistors 26, 32.

The input port 14 will then behave and act as a ground port and a voltage measurable at the second detection output 40 will drop down from a level close to the supply voltage level to a rather low level, that corresponds to a logical 0. It is the second resistor 36 that pulls up the output voltage measurable at the second detection output 40. As long as the ground port 16 is connected to the supply voltage source V1 the transistors 26, 32 will be effectively non-conductive so that in this case, which corresponds to the ordinary operation mode of the integrated circuit 10, the output voltage measurable at the second detection output 40 is almost equal to the supply voltage present at the supply port 12.

Figure 4:
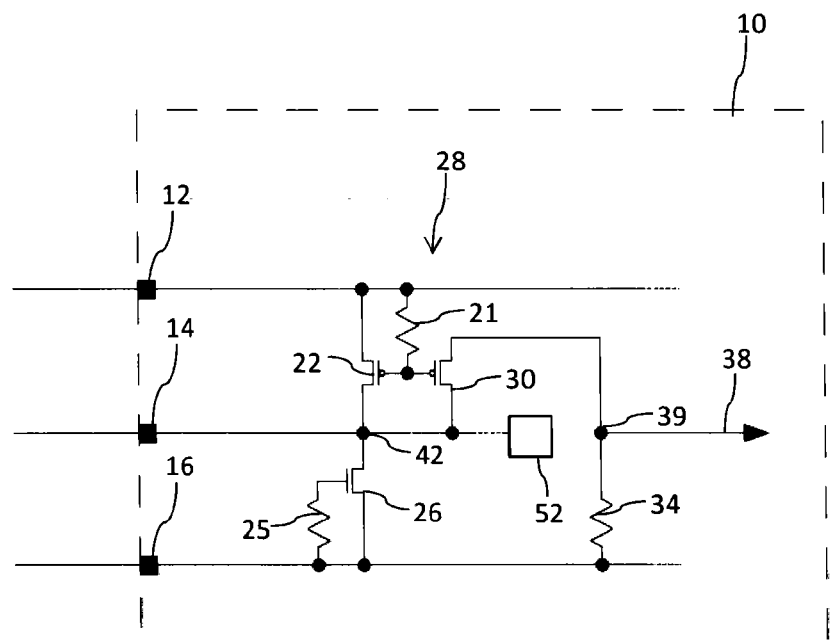
FIG. 4 is illustrative of another embodiment of the fault detection assembly.

In FIG. 4, another embodiment of a fault detection assembly 28 is illustrated. Here, it is the first diode-connected transistor 22 that is directly coupled and connected with an additional first detection transistor 30 of PMOS type. Compared to the configuration of the fault detection assembly 18 according to FIG. 2, the fault detection assembly 28 as illustrated in FIG. 4 is rather symmetric or mirrored. The fault detection assembly 28 is exclusively adapted to detect an interruption or disconnection of the supply port 12 while the fault detection assembly 18 according to FIG. 2 is exclusively adapted to detect ground fault or ground disconnection.

Similar as already described in connection to FIG. 2, the first fault detection transistor 30 is connected with its gate to the gate of the first diode-connected transistor 22. One of source and drain of the first fault detection transistor 30 is connected to the input port 14 while the other one of source and drain of the first fault detection transistor 30 is connected to the ground port 16 via a first resistor 34. Between the resistor 34 and the first fault detection transistor 30 there is located a first node 39 from which a first detection output 38 branches off.

In the event of interruption of the power supply the supply port 12 will experience a voltage drop. Consequently, the first fault detection transistor 30 as well as the first diode-connected transistor 22 will become conductive and will be switched on. As a consequence, electric charges or a current incident at the input port 14 will propagate through the first diode-connected transistor 22 and will serve to power up or to activate the integrated circuit 10. Since the drains of the first diode-connected transistor 22 and the first fault detection transistor 30 are arranged in parallel a certain current will also propagate through the first resistor 34 towards the ground port 16. As a consequence, the voltage detectable at the first detection output 38 will rise up to almost supply level, thereby indicating that the supply port 12 has been disconnected from a power supply.

As it is indicated in FIGS. 2 and 4, the input port 14 or a respective input line is connected to at least some type of logic component 52 that is operable to process the input signals delivered via the input port 14.

Figure 5:
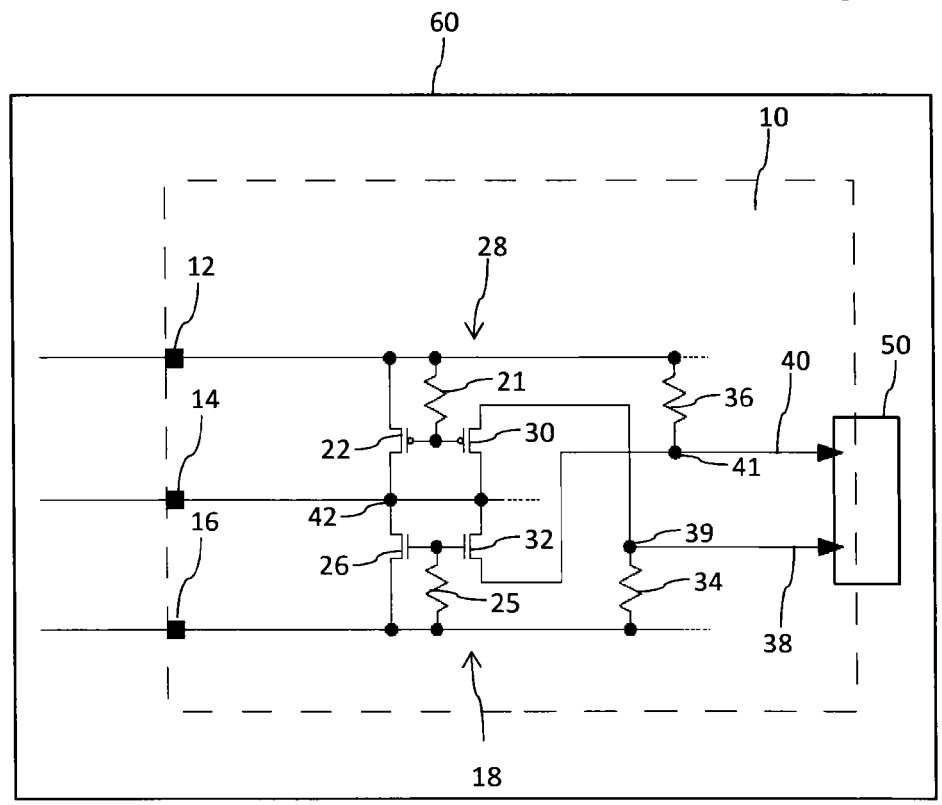
FIG. 5 shows a further embodiment of the fault detection assembly with first and second fault detection transistors and with first and second detection outputs.

In the embodiment as illustrated in FIG. 5, the two embodiments separately shown in FIGS. 2 and 4 are combined in a single fault detection assembly. There, a symmetric or mirrored arrangement of first and second fault detection transistors 30, 32 together with first and second diode-connected transistors 22, 26 is implemented. While first fault detection transistor 30 and first diode-connected transistor 22 are implemented as PMOS transistors, the second fault detection transistor 32 and the second diode-connected transistor 26 are implemented as NMOS transistors.

In practical implementations both the first fault detection transistor 30 and the first diode-connected transistor 26 may be realized by a single MOSFET chip. There, only one of the multitude of transistors provided by the MOSFET chip has to be connected to the ground port 16 via the first resistor 34. The second fault detection transistor 32 as well as the second diode-connected transistor 26 may be implemented in a similar or identical way.

In FIG. 5 there is further indicated a processor 50 or a logic component that is connected to the first and second detection outputs 38, 40. The processor 50 is operable to process the signals provided by first and second detection outputs 38, 40 in order to take and to trigger respective actions in case that a ground fault or a supply port disconnection occurs.

The integrated circuit 10 together with the fault detection assemblies 18, 28 are implementable in an electronic device 60 as it is indicated in FIG. 5.

What is claimed is:

1. A fault detection assembly of an integrated circuit having a supply port, an input port and a ground port, the fault detection assembly comprising:
   a first diode connected with one end to the supply port and connected with another end to the input port;
   a second diode connected with one end to the input port and connected with another end to the ground port;
   at least a first fault detection transistor of MOS type;
   wherein at least one of first and second diodes comprises a first diode-connected MOS transistor whose gate is connected to the gate of the first fault detection transistor, and
   wherein one of drain and source of the first fault detection transistor is connected to the input port and the other one of the first fault detection transistor's drain and source is connected to a first resistor connected to one of supply port and ground port.

2. The fault detection assembly according to claim 1, wherein a first detection output is connected to a first node that is located between the first resistor and the first fault detection transistor, and to a processor or a logic component.

3. The fault detection assembly according to claim 1, wherein the first diode comprises the first diode-connected MOS transistor, and wherein the second diode comprises a second diode-connected MOS transistor.

4. The fault detection assembly according to claim 3, further comprising a second fault detection transistor of MOS type, whose gate is connected to the gate of the second diode-connected MOS transistor.

5. The fault detection assembly according to claim 4, wherein one of drain and source of the second fault detection transistor is connected to the input port and the other one of the second fault detection transistor's drain and source is connected to a second resistor connected to one of supply port and ground port, inversely of the first resistor.

6. The fault detection assembly according to claim 5, wherein a second detection output is connected to a second node that is located between the second resistor and the second fault detection transistor.

7. The fault detection assembly according to claim 3, wherein the first diode-connected transistor is of PMOS type and wherein the second diode-connected transistor is of NMOS type.

8. The fault detection assembly according to claim 4, wherein the first fault detection transistor is of PMOS type and wherein the second fault detection transistor is of NMOS type.

9. The fault detection assembly according to claim 1, wherein at least one of the first diode-connected transistor and a second diode-connected transistor comprises numerous parallel connected transistors all located on a MOSFET chip.

10. The fault detection assembly according to claim 9, wherein at least one of the first fault detection transistor and a second fault detection transistor is located on the MOSFET chip.

11. An integrated circuit comprising:
a supply port;
an input port;
a ground port; and
a fault detection assembly comprising a first diode connected with one end to the supply port and connected with another end to the input port, a second diode connected with one end to the input port and connected with another end to the ground port, and at least a first fault detection transistor of MOS type,
wherein at least one of first and second diodes comprises a first diode-connected MOS transistor whose gate is connected to the gate of the first fault detection transistor, and
wherein one of drain and source of the first fault detection transistor is connected to the input port and the other one of the first fault detection transistor's drain and source is connected to a first resistor connected to one of supply port and ground port.

12. The integrated circuit according to claim 11,
wherein a first detection output is connected to a first node that is located between the first resistor and the first fault detection transistor,
wherein a second detection output is connected to a second node that is located between a second resistor and a second fault detection transistor, and
wherein a processor is connected to at least one of the first and second detection outputs and being operable to process a signal obtained via at least one of the first and second detections outputs.

13. An electronic device configured as a smart card, as a watch, as a cellular phone or as a smartphone comprising an integrated circuit comprising a supply port; an input port; a ground port; and a fault detection assembly comprising a first diode connected with one end to the supply port and connected with another end to the input port, a second diode connected with one end to the input port and connected with another end to the ground port, and at least a first fault detection transistor of MOS type,
wherein at least one of first and second diodes comprises a first diode-connected MOS transistor whose gate is connected to the gate of the first fault detection transistor, and
wherein one of drain and source of the first fault detection transistor is connected to the input port and the other one of the first fault detection transistor's drain and source is connected to a first resistor connected to one of supply port and ground port.

* * * * *